(12) United States Patent
Yamada

(10) Patent No.: US 7,768,817 B2
(45) Date of Patent: Aug. 3, 2010

(54) VCC CONTROL INSIDE DATA REGISTER OF MEMORY DEVICE

(75) Inventor: Shigekazu Yamada, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 12/052,271

(22) Filed: Mar. 20, 2008

(65) Prior Publication Data

US 2009/0238011 A1  Sep. 24, 2009

(51) Int. Cl.
*G11C 11/00* (2006.01)
(52) U.S. Cl. .................. 365/154; 365/189.05; 365/226
(58) Field of Classification Search .............. 365/154, 365/189.05, 226
See application file for complete search history.

(56) References Cited

U.S. PATENT DOCUMENTS

| 5,297,092 | A | * | 3/1994 | Johnson | 365/203 |
| 5,721,707 | A | * | 2/1998 | Villa et al. | 365/218 |
| 7,196,925 | B1 | * | 3/2007 | Tzou et al. | 365/154 |

* cited by examiner

*Primary Examiner*—Son Dinh
*Assistant Examiner*—Nam Nguyen
(74) *Attorney, Agent, or Firm*—Cool Patent, P.C.; Joseph P. Curtin

(57) ABSTRACT

A memory device including current-limiting circuitry coupled to a first inverter inside a data register is provided. The current-limiting circuitry controls a voltage supplied to the first inverter and a reference voltage may be adjusted so that the voltage supplied to the first inverter is prevented from dropping below a voltage supplied to a second inverter inside the data register. The memory device may include a switch to allow coupling to the current-limiting circuitry for programming of the memory device.

20 Claims, 4 Drawing Sheets

VCC CONTROL INSIDE DATA REGISTER OF MEMORY DEVICE

BACKGROUND

As memory technology heads towards products that use less power, and are lighter and more robust, flash memory products stand out as a good alternative over other storage solutions. Its ability to efficiently program, read, and erase blocks of data at a time is attractive.

In recent years, the programming performance of flash memory products has been enhanced, thus satisfying customers who prefer fast-programming, for example, greater than 10 Mb/sec. Other customers prefer low power consumption, for example, for simultaneous multi-chip usage over the need for such a high speed.

In general, bit line-charging during programming accounts for a large part of power consumption. In part, this is due to the lengthiness of bit lines. Most of the NAND flash memory products have the capability to suppress the charging current. However, it is difficult to control the charging current accurately due to RC delay changes due to variations in temperature and transistor models. As a result, data registers may be at a higher risk of malfunctions due to a larger charging current.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
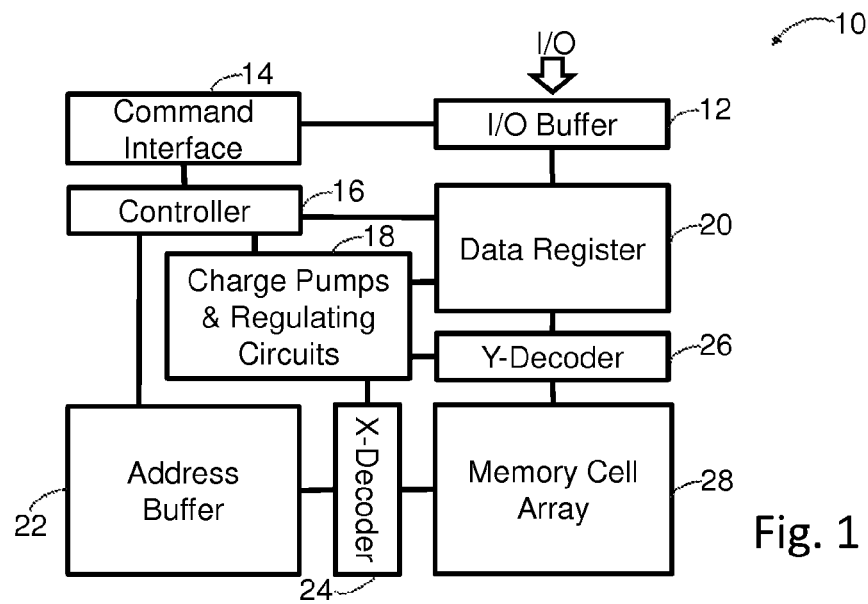
FIG. 1 is a simplified block diagram of a memory device according to one embodiment.

Referring to FIG. 1, a memory device according to one embodiment is shown at 10. The memory device 10 may be programmed with data, read to retrieve data, and erased to clear the memory device. Memory device 10 includes an input/output (I/O) buffer 12, a command interface 14, a controller 16, charge pumps and other regulating circuits 18, a data register 20, an address buffer 22, x-decoder 24, y-decoder 26, and a memory cell array 28. Other embodiments of the memory device may include other components or omit some of those illustrated in FIG. 1.

The I/O buffer 12 may be configured to receive input and output and act as an external interface. The I/O buffer 12 may hold inputted commands for controlling the memory device 10, address information, data to be entered into the memory cell array 28, and data retrieved from the memory cell array 28. The I/O buffer 12 may then send data to other components in the memory device 10. Commands are sent to the command interface 14. The command interface 14 receives and recognizes user input commands and directions. The command interface 14 further activates the controller 16.

The controller 16 is responsible for running the other components of the memory device 10 for programming and erasing of the memory cell array 28. The controller 16 may include a state machine for dedicated reading, erasing, and programming operations using operation code.

The controller 16 communicates with the charge pumps and other regulating circuits 18 to provide bias voltages and sustain dynamic or static loads during different operating conditions to the memory cell array 28. Other regulating circuits may include clocking circuits, and other peripheral circuits for operating the memory device 10. The charge pumps and other regulating circuits 18 also provide voltages to the data register 20, the x-decoder 24, the y-decoder 26, and other memory components that may require regulated voltages.

Data register 20 is capable of sensing data from the memory cell array 28, storing user input from the I/O buffer 12, and driving bit lines in the memory cell array 28. Data register 20 may store data immediately prior to programming or immediately after reading from the memory cell array 28. Data register 20 may include sense amplifiers and latches to sense and hold data.

The controller 16 sends address information corresponding to one or more memory cells of the memory cell array 28 to the address buffer 22 for programming and/or erasing of the memory cell(s). The address buffer 22 holds the addresses which are sent to the x-decoder 24 and y-decoder 26 to access the memory cell array 28. In response to a received address, the x-decoder 24 selects one or more rows of the memory cell array 28 for access. Similarly, upon receipt of an address, the y-decoder 26 selects one or more columns of the memory cell array 28 for access.

As shown in FIG. 1, memory device 10 is depicted as a NAND flash memory cell array, which is an erasable and programmable non-volatile memory. A NAND flash memory cell array includes memory cells serially connected between a drain selection transistor and a source selection transistor. The memory cell array 28 includes memory cells organized in blocks, sectors, rows, and columns. Each memory cell may be individually read and programmed. Blocks of data may be accessed in pages by the data register 20 and temporarily stored in the data register 20.

Alternatively, memory device 10 may include non-volatile random access memory (NVRAM), ferroelectric random access memory (FeRAM or FRAM), ferromagnetic random access memory (FM-RAM), magnetoresistive random access memory (MRAM), phase-change memory (PCM), read-only memory (ROM), programmable read-only memory (PROM), erasable programmable read-only memory (EPROM), electrically erasable programmable read-only memory (EEPROM), flash memory (for ex., flash NOR, flash EPROM), and other non-volatile memory. Further, memory device 10 may be formed and manufactured using MOS (metal oxide semiconductor) technology, CMOS (complementary MOS) technology, BiCMOS (bipolar CMOS) technology, or other semiconductor manufacturing technologies suitable for forming non-volatile memory. However, these are merely examples of the different types of memory device 10, and the scope of the claimed subject matter is not limited in these respects.

Figure 2:
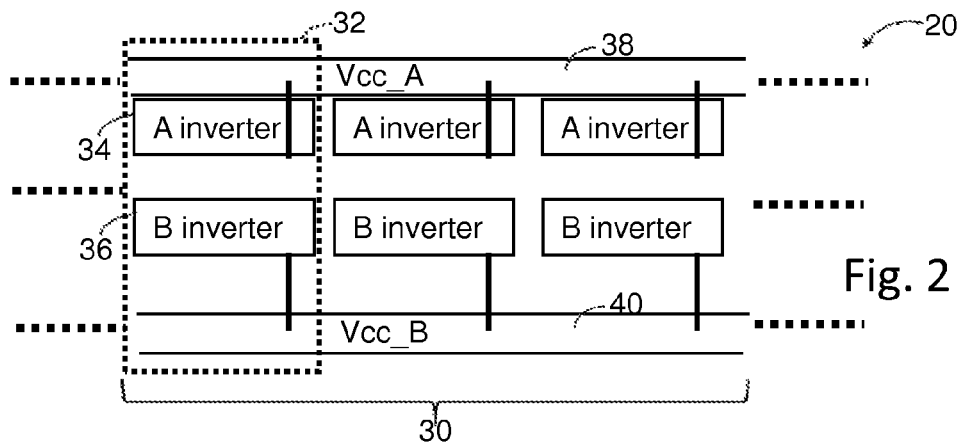
FIG. 2 is a simplified block diagram of a part of a data register of a memory device.

FIG. 2 is a simplified block diagram of a part of memory device 10, and in particular, the figure includes a portion 30 of data register 20. This diagram shows a simplistic view of data register 20, which may comprise a highly complex circuit in one or more embodiments. Referring particularly to a section 32 of data register 20, section 32 includes a first inverter 34 ("A inverter") and a second inverter 36 ("B inverter") connected to a first voltage line 38 and a second voltage line 40, respectively. Within data register 20, there are multiples of such sections 32 repeating, as indicated in the figure.

The first inverter of one or more of the plurality of sections 32 relies on the first voltage line 38 to supply Vcc_A, and the second inverter of one or more of the plurality of sections 32 relies on the second voltage line 40 to supply Vcc_B. Vcc_A may be a higher voltage, the same voltage, or a lower voltage than Vcc_B.

In programming a memory cell in the memory device 10, a current for charging a bit line associated with the memory cell is driven from the data register 20. In a NAND memory device, there may be many memory cells connected to one bit line. As a result, when programming, there may be a huge current draw on the first voltage line Vcc_A and therefore a large voltage drop, whereas the second voltage line Vcc_B may not have a huge current draw, which may lead to a collapse in the latch, as further described below.

Figure 3:
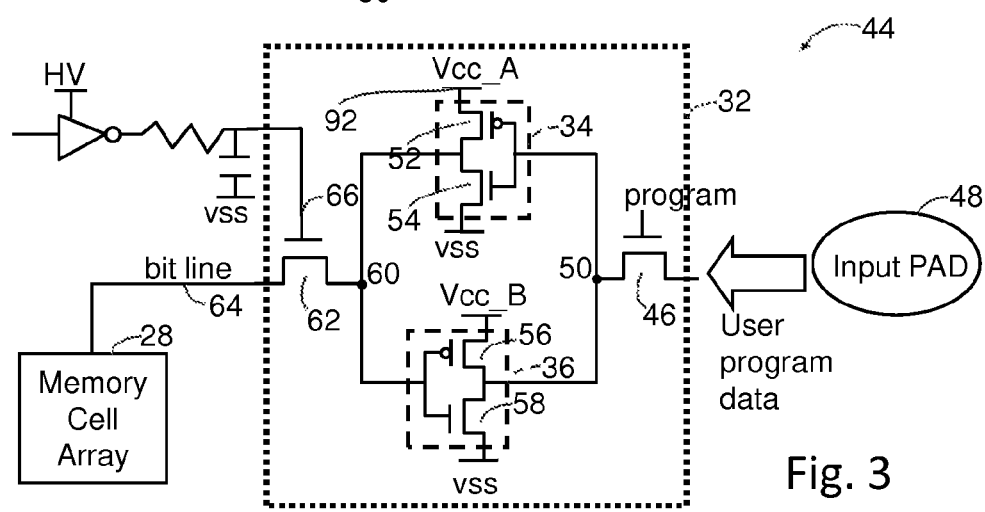
FIG. 3 is a simplified partial-circuit/partial-block diagram showing a section of the data register of FIG. 2 in more detail.

Referring to FIG. 3, a simplified partial-circuit/partial-block diagram of the data register of FIG. 2 is shown in more detail at 44. In one or more embodiments, block 32 (previously referred to as section 32 of data register 20) is referred to as a memory cell 32 configured to store one of two binary conditions: high (1) or low (0). The memory cell 32 includes an N-type field effect transistor (FET) 46 through which an input signal is applied for writing to the memory cell. The input signal may include user program data as entered through an input PAD 48. Depending on the condition to be stored in memory cell 32, the user program data sends an input signal to node 50 that is either high or low.

The memory cell 32 includes A inverter 34 and B inverter 36 as described in FIG. 2. Inverter 34 includes a P-type FET 52 coupled to an N-type FET 54. The source terminal of the P-type FET 52 is connected to the first voltage line (supplying Vcc_A) 38. The drain terminal of the P-type FET 52 is connected to the drain terminal of the N-type FET 54. The source terminal of the N-type FET 54 is connected to vss which may be a negative power source, low power source, or ground. The gate terminals of FETs 52 and 54 have the same value as node 50.

Inverter 36 includes a P-type FET 56 coupled to an N-type FET 58. The source terminal of the P-type FET 56 is connected to the second voltage line (supplying Vcc_B) 40. The drain terminal of the P-type FET 56 is connected to the drain terminal of the N-type FET 58. The source terminal of the N-type FET 58 is connected to vss. The gate terminals of FETs 56 and 58 have the same value as the drain terminals of FETs 52 and 54, and node 60.

The N-type FET 46 includes a gate controlled by a program control signal which determines whether the N-type FET 46 is closed (on) or open (off). If the program control signal is high, the N-type FET 46 is on, allowing the input signal to be sent to node 50. If the program control signal is low, no input signal is sent to node 50.

If the input signal provided to node 50 is low, the P-type FET 52 will close and the N-type FET 54 will open, pulling the voltage on node 60 to Vcc_A (high). The signal through node 60 and entering the gate terminals of FETs 56 and 58 is high. As a result, the P-type FET 56 will open and the N-type FET 58 will close, draining the voltage on node 50 to vss (low), thus reinforcing the input signal and state of the memory cell 32. If the input signal provided to node 50 is high, the P-type FET 52 will open and the N-type FET 54 will close, draining the voltage on node 60 to vss (low). Upon an entering low signal to the gate terminals of FETs 56 and 58, P-type FET 56 will close and N-type FET 58 will open, pulling the voltage on node 50 to Vcc_B (high), thus reinforcing the input signal and state of the memory cell 32.

Memory cell 32 further includes an N-type FET 62 which is on or off controlled via a program control signal for gating the signal exiting the memory cell 32. FET 62 is turned on to allow voltage to exit the memory cell 32 and charge a bit line 64 for programming the memory cell array 28.

The values held by the FETs 52, 54, 56, and 58 remain when FET 46 is off so that the memory cell 32 stays in the condition to which it has been switched by the input signal applied through FET 46. However, if each of the FETs do not receive sufficient voltage to exceed the threshold voltage Vt to switch the FETs to the desired states (either high or low), the memory cell may be in an indeterminate condition, resulting in a collapsed latch. For example, if the voltage Vcc_A provided to the source terminal is itself low, the voltage may not be great enough to switch the state of the FETs or to switch them in a timely fashion.

FET 62 is controlled by a high voltage signal to its gate terminal. The gate terminal of FET 62 may be coupled to an inverter, resistor, and/or capacitor coupled to vss, which may be used as a method of controlling current running through the bit line 64. However, the current may be difficult to control due to the RC delay variance from temperature and differences in transistor models. Thus, the current may run high causing voltage drops which may cause problems for switching states of the FETs.

Figure 4:
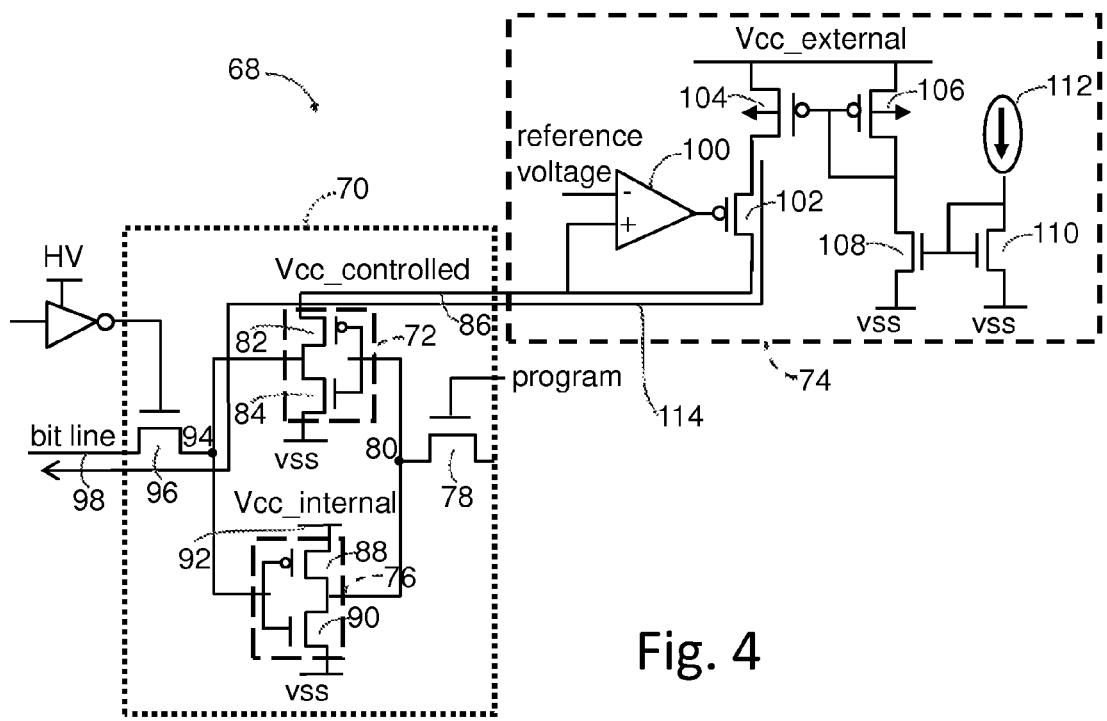
FIG. 4 is a simplified circuit diagram of a section of the data register with the first inverter coupled to current-limiting circuitry according to one embodiment.

According to one embodiment, FIG. 4 is a simplified circuit diagram of a section 70 of data register 20 including a first inverter 72 coupled to current-limiting circuitry 74 and a second inverter 76. Section 70 may be referred to as a memory cell 70 configured to store one of two binary conditions: high (1) or low (0), and may be structurally similarly to memory cell 32 as described above. An input signal including user program data (high or low signals) is applied for writing to the memory cell 70 and enters through N-type FET 78. The gate terminal of FET 78 may receive a program control signal for turning on the FET 78 to allow the input signal to be sent to node 80.

The first inverter 72 of memory cell 70 includes a P-type FET 82 and an N-type FET 84, with both transistors having their gate terminals connected to node 80. The source terminal of P-type FET 82 is connected to a first voltage line (supplying Vcc_controlled) 86 which is coupled to the current-limiting circuitry 74. The source terminal of N-type FET 84 is connected to vss which may be a negative power source, low power source, or ground. The drain terminal of P-type FET 82 is connected to the drain terminal of N-type FET 84, both of which are connected to the gate terminals of a pair of FETs of the second inverter 76, a P-type FET 88 and an N-type FET 90. The source terminal of P-type FET 88 is connected to a second voltage line (supplying Vcc_internal) 92, herein referred to as an "internal voltage". The source terminal of N-type FET 90 is connected to vss. The drain terminal of P-type FET 88 is connected to the drain terminal of N-type FET 90, both of which are connected to node 80.

If the input signal entering memory cell 70 is low, the P-type FET 82 will close and the N-type FET 84 will open, pulling a voltage of node 94 to Vcc_controlled (high). The signal through node 94 to the gate terminals of FETs 88 and 90 is high. The P-type FET 88 will open and the N-type FET 90 will close, draining the voltage on node 80 to vss (low), thus reinforcing the input signal and state of the memory cell 70. If the input signal provided to node 80 is high, the P-type FET 82 will open and the N-type FET 84 will close, draining the voltage on node 94 to vss (low). Upon an entering low signal to the gate terminals of FETs 88 and 90, P-type FET 88 will close and N-type FET 90 will open, pulling the voltage on node 80 to Vcc_internal (high), thus reinforcing the input signal and state of the memory cell 70.

Memory cell 70 further includes an N-type FET 96 gating voltage that may exit to charge a bit line 98 outside of memory cell 70. A program control signal, shown coupled to a high voltage and inverter, may be applied to the gate of FET 96 to turn on or off FET 96.

In one embodiment, the voltage supplied to the first inverter 72 is controlled using current-limiting circuitry. When FET 96 is closed and bit line 98 is drawing current for charging, the voltage drop in Vcc_controlled is regulated. As a result, the memory cell 70 does not encounter difficulty in switching the states of the FETs 82, 84, 88 and 90, thus preventing storage failures due to inadequate switching voltages.

Current-limiting circuitry 74 may include a comparator 100 having a reference voltage applied to its negative terminal. The reference voltage may be adjustable and include preset values that may be selected for specific usage. The positive terminal of the comparator 100 is connected to the first voltage line 86 which supplies Vcc_controlled to the memory cell 70. The comparator 100 outputs to the gate terminal of a P-type FET 102. The P-type FET 102 is coupled to a P-type FET 104 whose source terminal is connected to an external voltage source (supplying Vcc_external). A P-type FET 106 also has its source terminal connected to Vcc_external. The gate terminals of P-type FETs 104 and 106 are connected together and to the drain terminal of P-type FET 106 and the drain terminal of an N-type FET 108. FET 108 has its source terminal connected to vss. Current-limiting circuitry 74 may further include an N-type FET 110, also having its source terminal connected to vss. The gate terminals of N-type FETs 108 and 110 are connected to the drain terminal of N-type FET 110 and further coupled to a reference current source 112.

Current-limiting circuitry 74 may control Vcc_controlled by using comparator 100 to determine whether Vcc_controlled drops below an acceptable voltage level. Comparator 100 compares the voltages entering its negative and positive terminals. Therefore, Vcc_controlled (entering the positive terminal) may be compared to a preselected reference voltage (entering the negative terminal) which is generally set slightly higher than an external voltage (Vcc_external). If it is determined that Vcc_controlled drops significantly such that the reference voltage is higher, negative voltage will exit the comparator 100 to the gate terminal of P-type FET 102, which turns on FET 102. If P-type FET 104 is on, Vcc_controlled will be pulled up to Vcc_external. Further, current-limiting circuitry 74 may limit the current along path 114 by use of the reference current source 112 coupled to FETs 108, 110, 106 and Vcc_external as shown.

In one embodiment, Vcc_controlled may be adjusted by increasing or decreasing the reference voltage entering the comparator 100. In a non-limiting example, the reference voltage may be set to Vcc_external+0.4 V, and may be sufficient to prevent Vcc_controlled from dropping below Vcc_internal at any point in time during the charging of bit line 98.

As non-limiting examples, the reference current 112 may range from about 10 µA to about 20 µA, and the internal voltage Vcc_internal and the external voltage Vcc_external may range from about 1.5 V to about 5 V. It should be understood that current-limiting circuitry 74 may use different values of current and/or voltage and/or be built in alternate ways to achieve voltage-controlling/current-limiting capabilities. For example, voltage dividers and capacitors (all not depicted in the figure) may be included for current-limiting circuitry to function as described. Other embodiments of the current-limiting circuitry 74 may include other components or omit some of those illustrated in FIG. 4.

Figure 5:
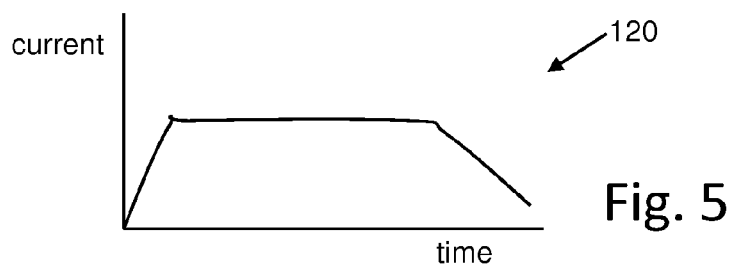
FIG. 5 is a plot showing current versus time, as taken from the arrow in FIG. 4.
Figure 6:
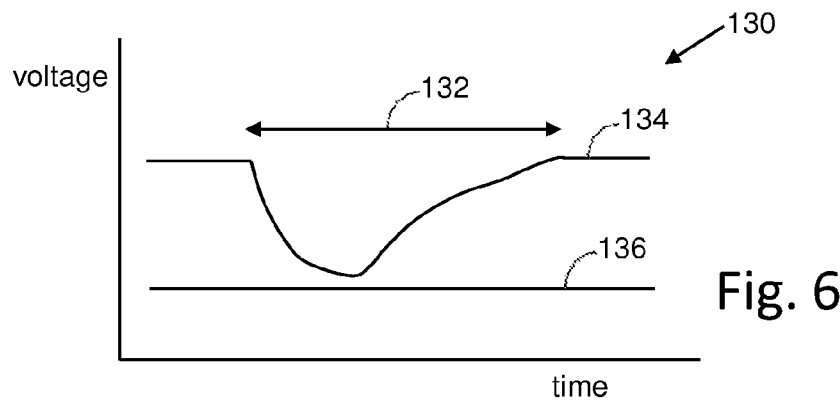
FIG. 6 is a plot showing voltage supplied to a first inverter and voltage supplied to a second inverter versus time.

It should be noted that FIG. 5 and FIG. 6 are not drawn to scale. FIG. 5 is a plot 120 of the relationship between current and time following the path (114 of FIG. 4) of the charging bit line 98 through memory cell 70. With the current-limiting circuitry 74 in place to control the voltage supplied to the first inverter 72 in memory cell 70, the current does not spike or ramp up as quickly as current in data registers without bit line charging-current suppression.

FIG. 6 is a plot 130 of the relationship between voltage and time following the path 114 of the charging bit line 98 through memory cell 70. As mentioned above, during the bit line charge period 132, the reference voltage entering the comparator 100 may be adjusted such that Vcc-controlled (the voltage supplied to the first inverter) 134 does not dip below Vcc-internal (the voltage supplied to the second inverter) 136. As mentioned previously, if the voltage supplied to the second inverter becomes greater than the voltage supplied to the first inverter, the latch may collapse and lead to a problem in storing the state of the memory cell.

Figure 7:
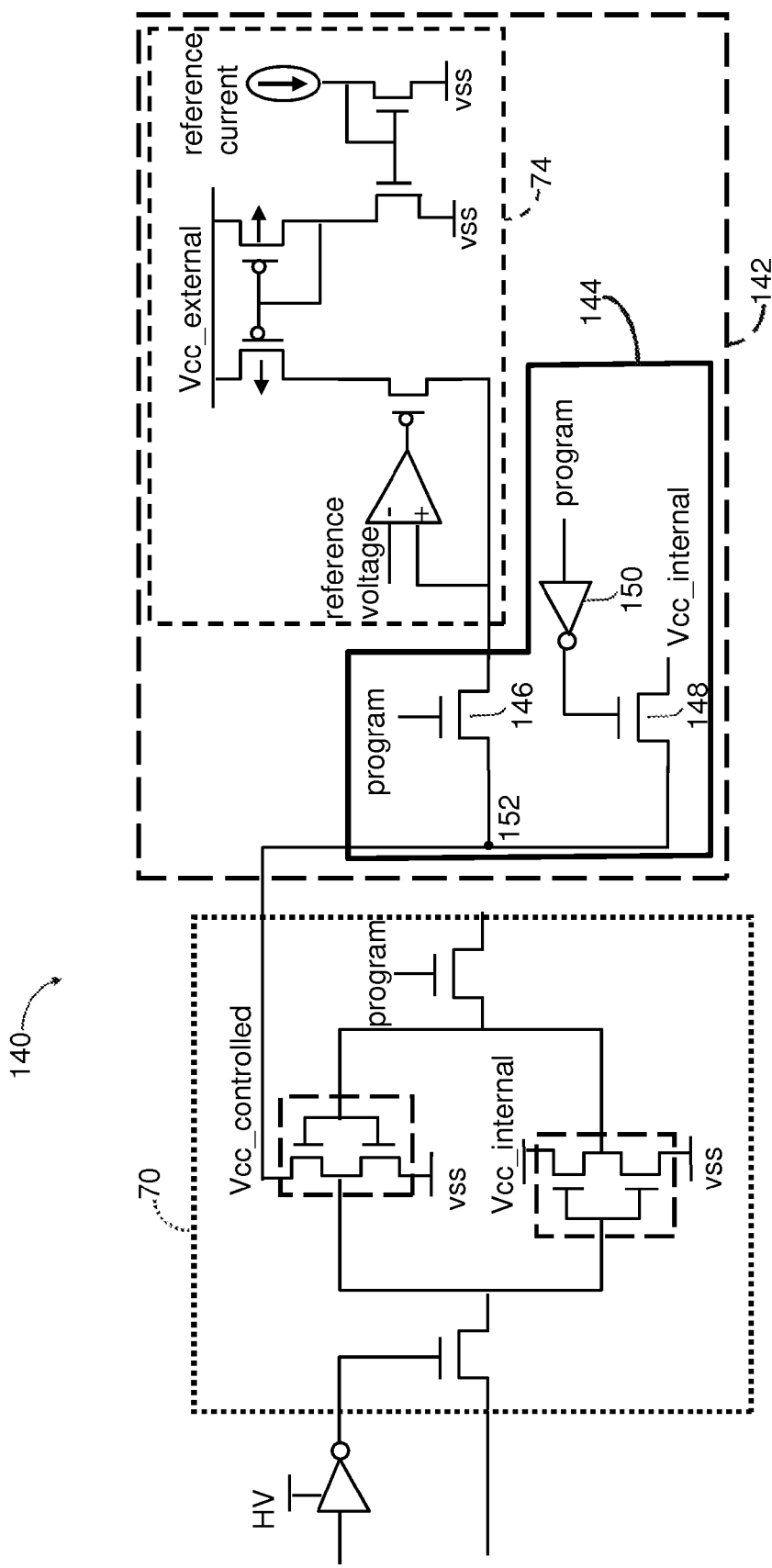
FIG. 7 is a simplified circuit diagram a portion of the memory device according to one embodiment.

Referring now to FIG. 7, a simplified circuit diagram of a portion of memory device 10 according to one embodiment is shown at 140. Memory device 10 includes memory cell 70, as described above, of the data register 20 coupled to current-limiting circuitry 142. Current-limiting circuitry 142 includes current-limiting circuitry 74, as described in FIG. 4 above, and further includes a switch 144, configured to couple memory cell 70 to current-limiting circuitry 74. Switch 144 includes an N-type FET 146 with its gate terminal receiving a program control signal that allows FET 146 to be turned on or off. The source terminal of FET 146 is connected to current-limiting circuitry 74. Switch 144 further includes an N-type FET 148 with its gate terminal receiving a program control signal through an inverter 150. The source terminal of FET 148 is connected to an internal voltage line (supplying Vcc_internal). The drain terminals of FET 146 and FET 148 are connected to node 152.

If a program control signal to FET 146 and inverter 150 is high, FET 146 will close and FET 148 will open, connecting node 152 to the current-limiting circuitry 74. If programming of the memory cell is desired, the program control signal may be set to high. If a program control signal to FET 146 and inverter 150 is low, FET 146 will open and FET 148 will close, connecting node 152 to Vcc_internal, thus the first inverter will be supplied with the same or approximately the same voltage that the second inverter is supplied with.

Switch 144 allows changing of the voltage source to the first inverter. For example, after a programming mode of the memory device 10, the program control signal may be set to low. The voltage supplied to the first inverter will be switched such that Vcc_controlled is equivalent to Vcc_internal, thus the voltages supplied to the first inverter and the second inverter are equivalent in one or more embodiments, although the scope of the claimed subject matter is not limited in this respect.

It should be noted that a program control signal as mentioned herein may be applied by a common source and therefore have the same value at any instance in time. Alternatively, a program control signal may be separately generated and can individually and independently control each corresponding gate.

Figure 8:
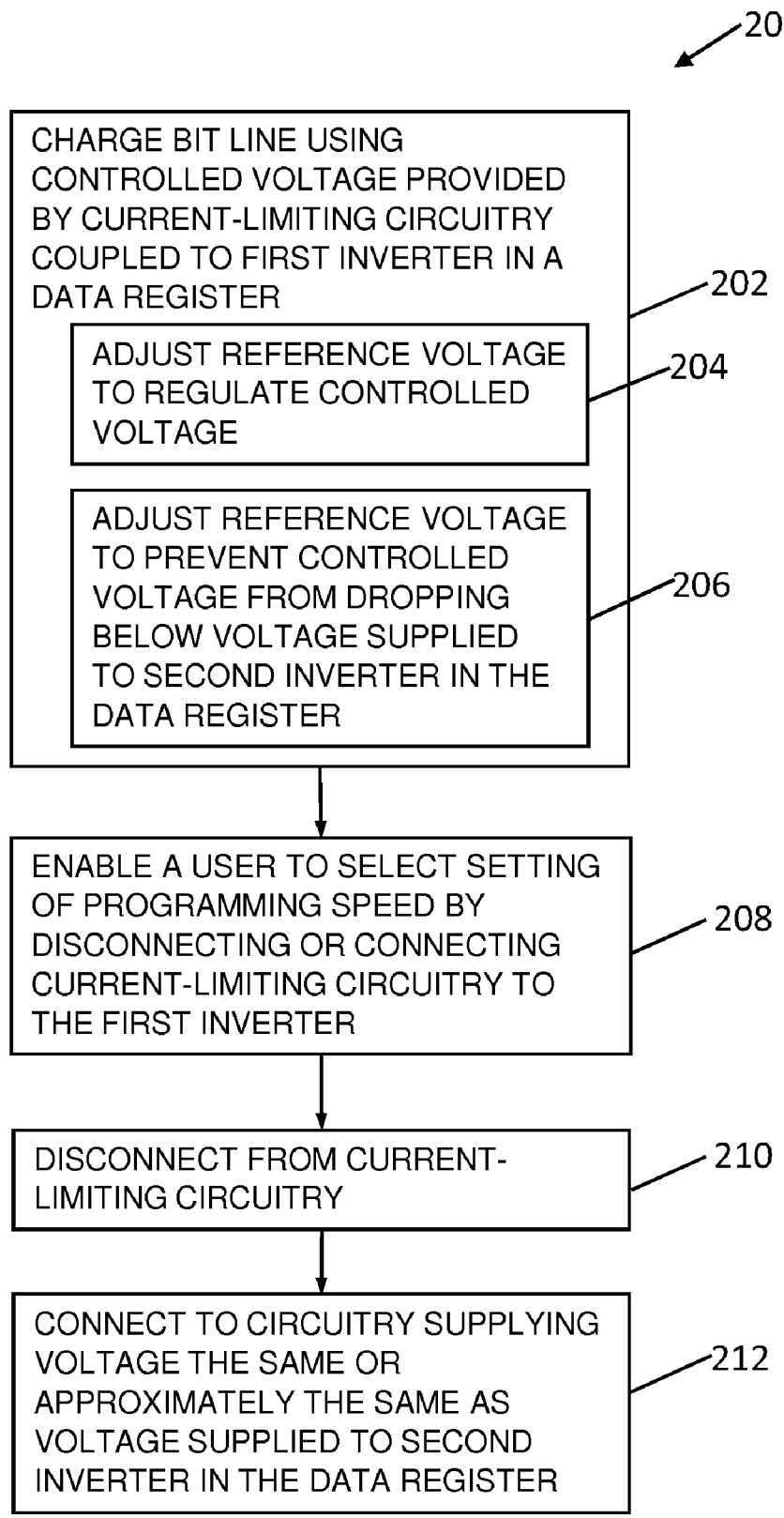
FIG. 8 is a flowchart of a method of programming a memory device according to one embodiment.

According to one embodiment, FIG. 8 shows a method 200 of programming a memory device. Method 200 includes, at 202, charging a bit line using controlled voltage provided by current-limiting circuitry coupled to a first inverter in a data register. At 204, block 202 may include adjusting a reference voltage to a comparator to control voltage supplied to the first inverter (controlled voltage). At 206, block 204 may include adjusting the reference voltage to the comparator to prevent the controlled voltage from dropping below voltage supplied to a second inverter in the data register.

Method 200 may further include, at 208, enabling a user to select a setting of programming speed by disconnecting or connecting current-limiting circuitry to the first inverter. For example, for high programming speed, the user may disconnect the current-limiting circuitry. At 210, method 200 may include disconnecting from the current-limit circuitry, and at 212, connecting to circuitry supplying voltage the same or approximately the same as voltage supplied to a second inverter in the data register.

It is appreciated that Vcc control for a data register of a memory device has been explained with reference to one general exemplary embodiment, and that the disclosed subject matter is not limited to the specific details given above. Specifically, as mentioned above, current-limiting circuitry may include other components or omit some of those illustrated in FIGS. 4 and 7. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the invention is not limited to the details described above. Rather, it is the following claims including any amendments thereto that define such scope and variations.

What is claimed is:

1. A memory device, comprising:
    a data register capable of receiving data for programming into a memory cell array, the data register coupled to a bit line, the data register comprising:
        a first inverter coupled to a first voltage line and a third voltage line; and
        a second inverter coupled to the first inverter, the second inverter further coupled to a second voltage line and the third voltage line, the second voltage line being different from the first voltage line; and
    current-limiting circuitry coupled to the first inverter and capable of supplying a controlled voltage through the first voltage line to charge the bit line.

2. The memory device of claim 1 wherein the controlled voltage is prevented from dropping below an internal voltage supplied by the second voltage line.

3. The memory device of claim 2, further comprising a switch capable of disconnecting the current-limiting circuitry from the first inverter.

4. The memory device of claim 3, wherein the switch is further capable of connecting the first inverter to an internal voltage.

5. The memory device of claim 4, wherein the current-limiting circuitry comprises a comparator coupled to a reference voltage.

6. The memory device of claim 5, wherein the reference voltage is adjusted to control the controlled voltage.

7. The memory device of claim 6, wherein the first inverter is coupled between the first voltage line and the third voltage line, and
    wherein the second inverter is coupled between the second voltage line and the third voltage line.

8. The memory device of claim 1 wherein the current-limiting circuitry comprises a comparator coupled to a reference voltage.

9. The memory device of claim 8 wherein the reference voltage is adjusted to control the controlled voltage.

10. The memory device of claim 1 wherein the controlled voltage is greater than an internal voltage supplied by the second voltage line.

11. The memory device of claim 1 wherein the current-limiting circuitry comprises a reference current source.

12. The memory device of claim 1 wherein the current-limiting circuitry comprises an external voltage source.

13. The memory device of claim 1 further comprising a switch capable of disconnecting the current-limiting circuitry from the first inverter.

14. The memory device of claim 13 wherein the switch is further capable of connecting the first inverter to an internal voltage.

15. The memory device of claim 1 wherein the memory cell array comprises a NAND flash or NOR flash.

16. A method of programming a memory device, the method comprising:
    charging a bit line using controlled voltage supplied by current-limiting circuitry coupled to a first inverter inside a data register, the current-limiting circuitry comprising an external voltage source, a reference current source, and a reference voltage to control the voltage supplied to the first inverter; and
    disconnecting the current-limiting circuitry from the first inverter to operate the memory device at a higher performance during programming.

17. The method of claim 16, further comprising connecting the first inverter to the same or substantially similar voltage supplied to a second inverter inside the data register.

18. The method of claim 16, further comprising enabling a user to select a setting of programming speed by disconnecting or connecting the current-limiting circuitry to the first inverter.

19. The method of claim 16, wherein during said charging a bit line, further comprising adjusting the reference voltage to control the voltage supplied to the first inverter.

20. The method of claim 19, wherein during said charging a bit line, further comprising adjusting the reference voltage to prevent controlled voltage from dropping below a voltage supplied to a second inverter inside the data register.

* * * * *